(12) United States Patent
Cheng et al.

(10) Patent No.: US 10,978,149 B1
(45) Date of Patent: Apr. 13, 2021

(54) RESISTIVE MEMORY APPARATUS AND ADJUSTING METHOD FOR WRITE-IN VOLTAGE THEREOF

(71) Applicant: Winbond Electronics Corp., Taichung (TW)

(72) Inventors: Ju-Chieh Cheng, Taichung (TW); Ying-Shan Kuo, Taichung (TW); Lih-Wei Lin, Taichung (TW); Lung-Chi Cheng, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/872,374

(22) Filed: May 12, 2020

(51) Int. Cl.
*G11C 13/00* (2006.01)

(52) U.S. Cl.
CPC ...... *G11C 13/0064* (2013.01); *G11C 13/0038* (2013.01); *G11C 13/0061* (2013.01); *G11C 13/0097* (2013.01)

(58) Field of Classification Search
CPC ............ G11C 13/0064; G11C 13/0061; G11C 13/0038; G11C 13/0097
See application file for complete search history.

(56) References Cited

U.S. PATENT DOCUMENTS

| 9,019,755 B2* | 4/2015 | Otsuka | G11C 13/0069 365/163 |
|---|---|---|---|
| 9,349,451 B1* | 5/2016 | Lin | G11C 13/0064 |
| 10,770,140 B2* | 9/2020 | Strachan | G11C 13/003 |
| 2009/0040815 A1* | 2/2009 | Kang | G11C 13/0069 365/163 |
| 2011/0188292 A1* | 8/2011 | Joo | G11C 13/0064 365/148 |
| 2015/0243353 A1* | 8/2015 | Lee | G11C 13/0069 365/148 |
| 2016/0155505 A1* | 6/2016 | Lin | G11C 13/0097 365/148 |
| 2017/0125098 A1* | 5/2017 | Hou | G11C 13/0064 |
| 2020/0135273 A1* | 4/2020 | Pasotti | G11C 13/0038 |

\* cited by examiner

*Primary Examiner* — Khamdan N. Alrobaie
(74) *Attorney, Agent, or Firm* — JCIPRNET

(57) ABSTRACT

A resistive memory apparatus and an adjusting method for write-in voltage thereof are provided. The adjusting method for write-in voltage includes: selecting an under test memory cell array in a resistive memory; performing N reset operations on a plurality of memory cells of the under test memory cell array according to a reset voltage, and performing N set operations on the memory cells of the under test memory cell array according to a set voltage, wherein n is an integer greater than 1; calculating a reset time variation rate of the reset operations and a set time variation rate of the set operations; and adjusting a voltage value of one of the set voltage and the reset voltage according to the reset time variation rate and the set time variation rate.

17 Claims, 5 Drawing Sheets

RESISTIVE MEMORY APPARATUS AND ADJUSTING METHOD FOR WRITE-IN VOLTAGE THEREOF

TECHNICAL FIELD

The invention relates to a resistive memory apparatus, and more particularly, relates to an adjusting method for write-in voltage of a resistive memory apparatus.

BACKGROUND

In the technical field of resistive memory, due to various possibilities including environmental factors, process drift and the like, the physical characteristics of multiple memory cells in a single integrated circuit and between dies may be uneven. Under such circumstances, how to set a write-in voltage (including a set voltage and a reset voltage) of the resistive memory so that a reset time and a set time of the memory cell can be balanced becomes an important issue to be addressed.

SUMMARY

The invention provides a resistive memory apparatus and an adjusting method for write-in voltage, which can balance the times required for performing reset operations and set operations.

The adjusting method for write-in voltage of the invention is adapted to a resistive memory. The adjusting method for write-in voltage includes: selecting an under test memory cell array in a resistive memory; performing N reset operations on a plurality of memory cells in the under test memory cell array according to a reset voltage, and performing N set operations on the memory cells of the under test memory cell array according to a set voltage, wherein n is an integer greater than 1; calculating a reset time variation rate of the reset operations and a set time variation rate of the set operations; and adjusting a voltage value of one of the set voltage and the reset voltage according to the reset time variation rate and the set time variation rate.

The resistive memory apparatus of the invention includes a under test memory cell array and a controller. The controller is coupled to the under test memory cell array. The controller is configured to perform the adjusting method for write-in voltage described above.

Based on the above, according to the embodiments of the invention, the reset operations and the set operations are performed on the under test memory cell array being a part of the resistive memory. Further, by adjusting one of the reset voltage and the set voltage according to the reset time variation rate of the reset operations and the set time variation rate of the set operations, write-in times required for the reset operations and the set operations may be balanced to improve use efficiency of the resistive memory.

DETAILED DESCRIPTION

Figure 1:
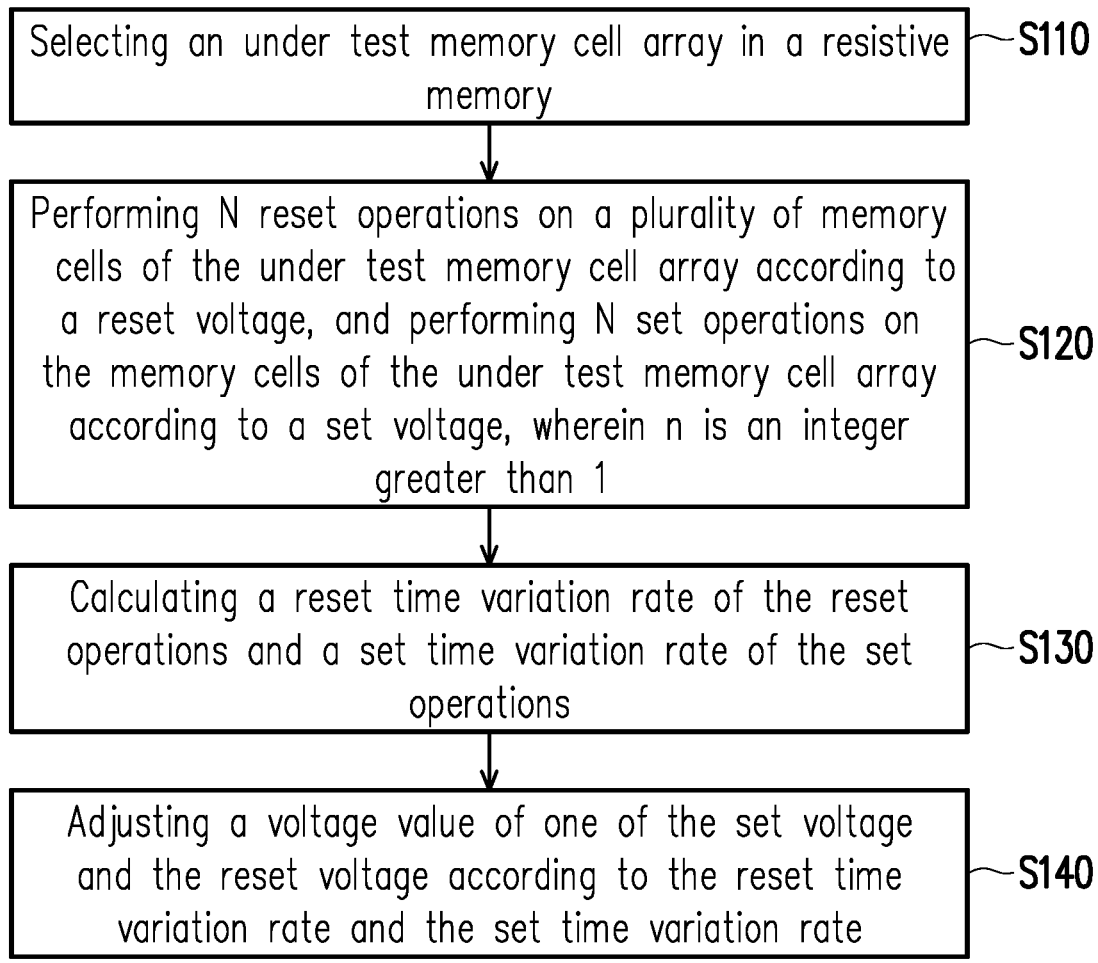
FIG. 1 illustrates a flowchart of the adjusting method for write-in voltage in an embodiment of the invention.

Referring to FIG. 1, FIG. 1 illustrates a flowchart of the adjusting method for write-in voltage in an embodiment of the invention. The adjusting method for write-in voltage of the present embodiment is adapted to a resistive memory. A write-in operation of the resistive memory includes a reset operation and a set operation. A write-in voltage includes a reset voltage and a set voltage. In step S110, one memory array in the resistive memory may be selected to serve as an under test memory cell array. Next, in step S120, N reset operations are performed on a plurality of memory cells of the under test memory cell array according to a reset voltage, and N set operations are performed on the memory cells of the under test memory cell array according to a set voltage, wherein n is an integer greater than 1. Here, in one of said reset operations, after the reset voltage is applied to the memory cells for a period of time, a resistance value of the memory cells may be verified to know whether the reset operation is completed. If a verification result indicates that the resistance value of the memory cells is not high enough, the operation of applying the reset voltage the memory cells is performed again. The operation of applying the reset voltage may be performed one or more times until the resistance value of the memory cells is greater than a preset threshold. Similarly, in one of said set operations, after the set voltage is applied to the memory cells for a period of time, the resistance value of the memory cells may be verified to know whether the set operation is completed. If a verification result indicates that the resistance value of the memory cells is not low enough, the operation of applying the set voltage to the memory cells is performed again. The operation of applying the set voltage may be performed one or more times until the resistance value of the memory cells is less than another preset threshold.

Next, in step S130, a reset time variation rate of the reset operations is calculated, and a set time variation rate of the set operations is calculated. Here, it should be noted that, the memory cells of the resistive memory may have physical characteristic variations due to multiple write-in operations. Therefore, a first time required for performing a first reset operation on the memory cells may be different from a second time required for performing an N-th reset operation on the memory cells. Normally, the second time is greater than the first time. Similarly, a third time required for performing a first set operation on the memory cells may be different from a fourth time required for performing an N-th set operation on the memory cells. Normally, the fourth time is greater than the third time.

The reset time variation rate in step S130 may be calculated according to the first time and the second time described above. In this embodiment, the reset time variation rate is equal to a difference between the second time and the first time divided by the first time. Similarly, the set time variation rate may be calculated according to the third time and the fourth time described above. In this embodiment, the set time variation rate is equal to a difference between the fourth time and the third time divided by the third time.

Next, in step S140, a voltage value of one of the set voltage and the reset voltage is adjusted according to the reset time variation rate and the set time variation rate obtained in step S130. Specifically, in step S140, the reset time variation rate and the set time variation rate may be compared first, and an adjustment mechanism for the voltage value of one of the set voltage and the reset voltage may be activated when an absolute value of the difference between the reset time variation rate and the set time variation rate is greater than a preset threshold. The set voltage is selected and adjusted when the set time variation rate is greater than the reset time variation rate. The reset voltage is selected and adjusted when the reset time variation rate is greater than the set time variation rate.

Here, when the set time variation rate is overly large, it means that after the set operation is performed multiple times, a longer set time is required for performing the set operations on the memory cells. Therefore, in this embodiment, by increasing a voltage absolute value of the set voltage, the set time can be shortened for the memory cells and the set time required for performing the set operations on the memory cells may be closer to a reset time required for performing the reset operations to maintain a time balance of the set operations and the reset operations for the memory cells. Naturally, when the reset time variation rate is overly large, it means that after the reset operation is performed multiple times, the reset time needs to be longer for performing the reset operations on the memory cells. Therefore, in this embodiment, by increasing a voltage absolute value of the reset voltage, the reset time can be shortened for the memory cells to thereby maintain the time balance of the set operations and the reset operations for the memory cells.

Figure 2:
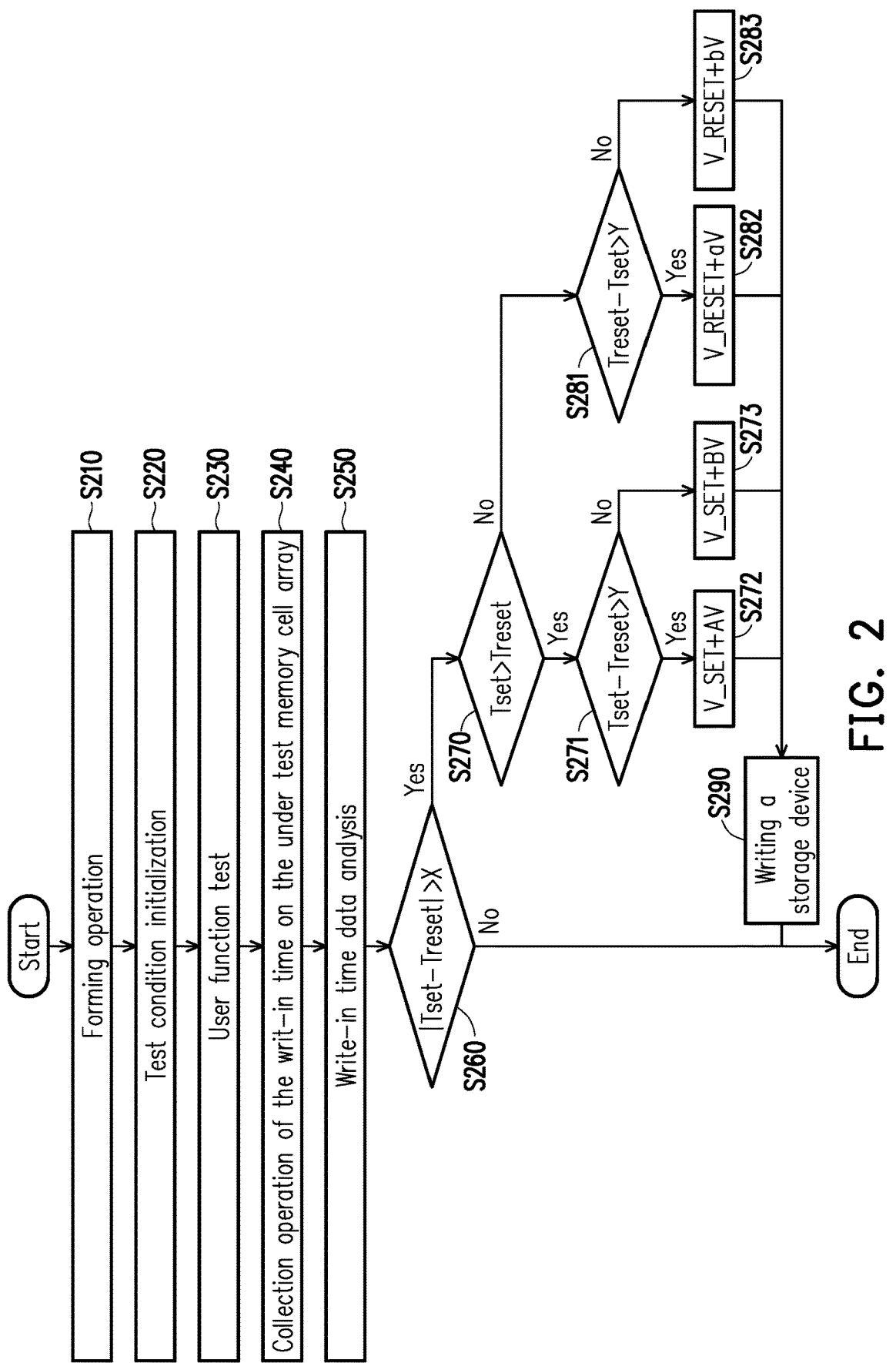
FIG. 2 illustrates a flowchart of a testing operation of a resistive memory in an embodiment of the invention.

Referring to FIG. 2, FIG. 2 illustrates a flowchart of a testing operation of a resistive memory in an embodiment of the invention. In step S210, a forming operation is performed on all the memory cells in the resistive memory. Here, a bias voltage may be applied to the memory cells through the forming operation performed on resistive memory cells. When the electric field on the memory cell exceeds a critical value, the dielectric layer will collapse, and cause the dielectric layer to have a variable resistance characteristic. The forming method is configured to perform an initialization operation on the resistive memory cells.

Next, a test initialization operation is performed in step S220, and a user function test is performed on the resistive memory in step S230. In step S240, the under test memory cell array in the resistive memory is selected, and a collection operation of the write-in time is performed on the under test memory cell array. Then, in step S250, a data analysis operation is performed on the write-in time obtained in step S240. Here, it should be noted that, in the collection operation of the write-in time, the N set operations and the N reset operations may be performed on the memory cells of the under test memory cell array, and the reset time variation rate of the reset operations and the set time variation rate of the set operations may be calculated. N is an integer greater than 1.

Here, it should be noted that N may be set by the designer without particular limitation.

In step S260, an absolute value of a difference between a set time variation rate Tset and a reset time variation rate Treset (|Tset−Treset|) is calculated. When the absolute value of the difference between the set time variation rate Tset and the reset time variation rate Treset is greater than a preset threshold X, an adjustment mechanism for the reset voltage or the set voltage is activated and step S270 is performed. If the absolute value of the difference between the set time variation rate Tset and the reset time variation rate Treset is not greater than the preset threshold X, this testing process ends. Next, in step S270, whether the set time variation rate Tset is greater than the reset time variation rate Treset is determined. When the set time variation rate Tset is greater than the reset time variation rate Treset, step S271 is performed. On the contrary, when the set time variation rate Tset is less than the reset time variation rate Treset, step S281 is performed.

In step S271, the reset time variation rate Treset is subtracted from the set time variation rate Tset, and whether a variation rate difference of the set time variation rate Tset to the reset time variation rate Treset is greater than a reference value Y preset is determined. When the variation rate difference is greater than the reference value Y, it means that the set voltage needs a relatively large adjustment. Accordingly, in step S272, a first voltage AV is added to a set voltage V_SET to increase the voltage value of the set voltage. When the variation rate difference is less than the reference value Y, it means that the set voltage only needs a relatively small adjustment. Accordingly, in step S273, a second voltage BV is added to the set voltage V_SET to increase the voltage value of the set voltage. Here, the first voltage AV is greater than the second voltage BV.

In step S281, the set time variation rate Tset is subtracted from the reset time variation rate Treset, and whether a variation rate difference of the reset time variation rate Treset to the set time variation rate Tset is greater than the reference value Y preset is determined. When the variation rate difference is greater than the reference value Y, it means that the reset voltage needs a relatively large adjustment. Accordingly, in step S282, a third voltage aV is added to a reset voltage V_RESET to increase the voltage value of the reset voltage. When the variation rate difference is less than the reference value Y, it means that the reset voltage only needs a relatively small adjustment. Accordingly, in step S283, a fourth voltage bV is added to the reset voltage V_RESET to increase the voltage value of the reset voltage. Here, the third voltage aV is greater than the fourth voltage bV.

Finally, in step S290, adjustment information of the reset voltage and the set voltage are written into a storage device, and then the testing process ends. Here, it should be noted that, the adjustment information of the reset voltage and the set voltage may be written into the storage device in form of digital data. The storage device may be any volatile or non-volatile memory element without particular limitation.

In this embodiment, the process of FIG. 2 may be performed when the resistive memory performs the testing operation. Moreover, after the testing operation is completed, the resistive memory adjusts the initialized reset and set voltages according to the adjustment information of the reset voltage and the set voltage and operates all the memory arrays other than the under test memory array accordingly.

It should be noted that, the under test memory cell array may be a part of the resistive memory. In other words, the steps S240 to S290 in FIG. 2 can be performed only for a small part of the resistive memory, which can accelerate the adjustment operation of write-in voltage.

FIG. 3A, FIG. 3B, FIG. 4A and FIG. 4B respectively illustrate examples of write time shifts after multiple operations. The examples of the drawings show that, after the reset operation is performed multiple times on the memory cells of the under test memory cell array and the set operation is performed multiple times on the memory cells of the under test memory cell array, a curve CV1 is obtained by recording the reset time of the reset operations and a curve CV2 is obtained by recording the set time of the set operations.

Figure 3A:
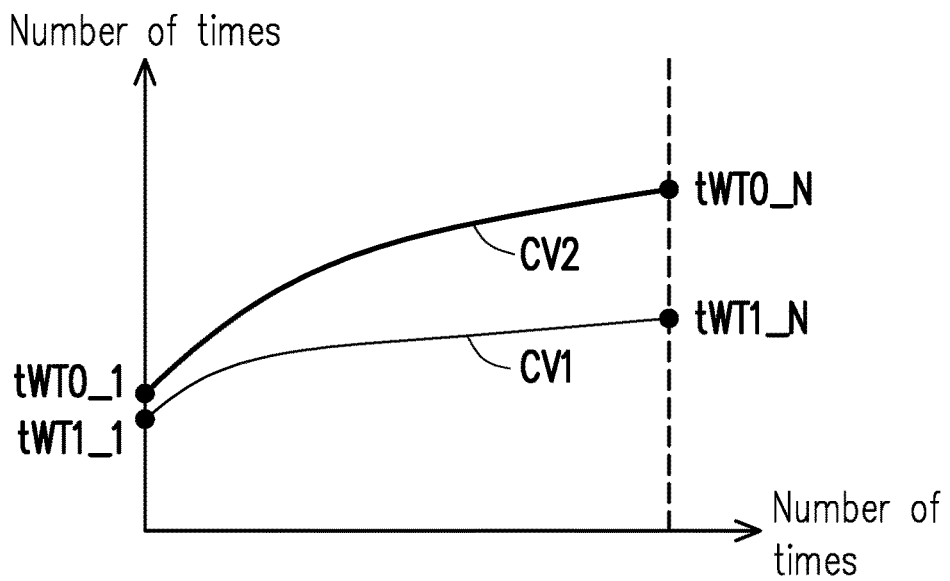
FIG. 3A, FIG. 3B, FIG. 4A and FIG. 4B are schematic diagrams respectively illustrating the adjusting method for write-in voltage in different embodiments of the invention.

The adjusting method for write-in voltage of the invention is described below with reference to FIG. 3A, FIG. 3B, FIG.

Figure 4A:
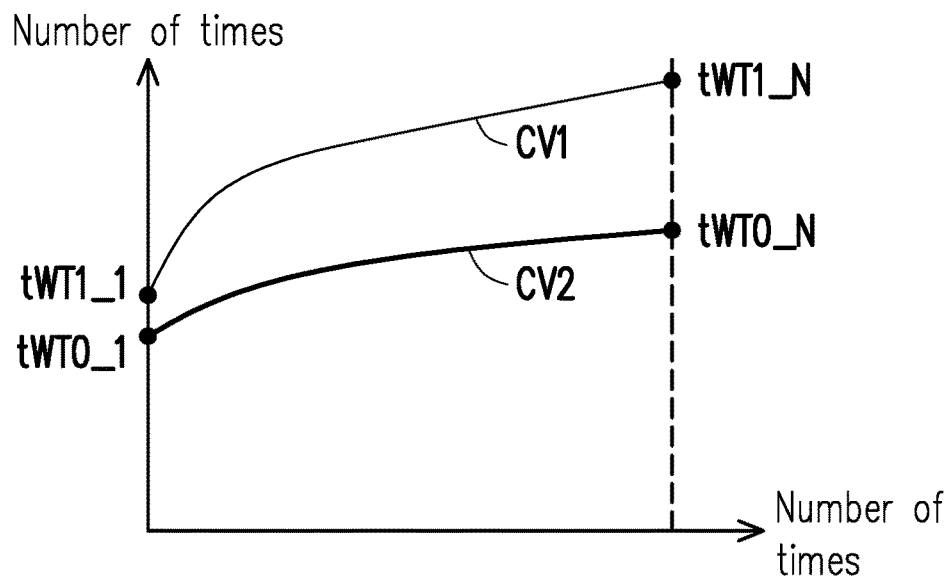
Figure 4B:
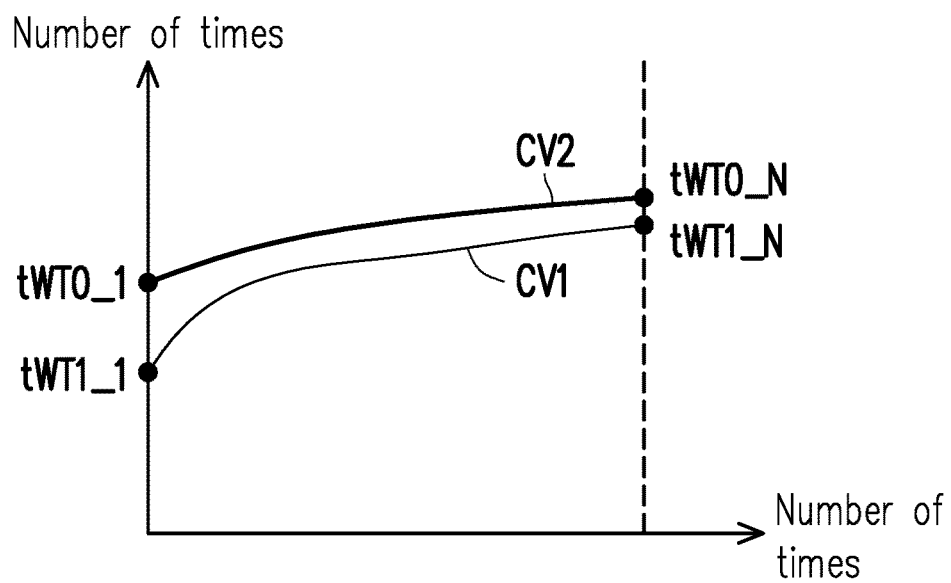

4A, and FIG. 4B. In FIG. 3A, a first reset time tWT1_1 required for performing a first reset operation is, for example, 0.6 milliseconds; a second reset time tWT1_N required for performing an N-th reset operation is, for example, 0.69 milliseconds; a first set time tWT0_1 required for performing a first set operation is, for example, 0.7 milliseconds; a second set time tWT0_N required for performing an N-th set operation is, for example, 1.0 milliseconds. Accordingly, it can calculated from the above that the reset time variation rate=(tWT1_N−tWT1_1)/tWT1_1=0.15, and the set time variation rate=(tWT0_N−tWT0_1)/tWT0_1=0.43. Therefore, a difference of the set time variation rate to the reset time variation rate=0.28.

Under the premise that the set time variation rate is greater than the reset time variation rate, by determining whether the difference of the set time variation rate to the reset time variation rate is greater than the reference value Y preset, steps S272 or S273 of FIG. 2 may be performed to adjust the voltage value of the set voltage and increase the energy of the set operation.

Figure 3B:
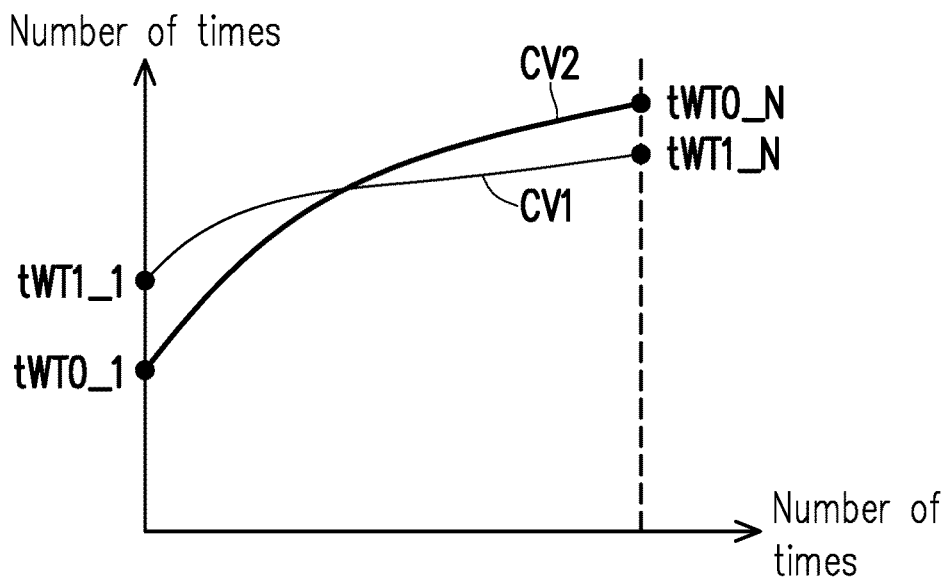

In FIG. 3B, a first reset time tWT1_1 required for performing a first reset operation is, for example, 1.0 milliseconds; a second reset time tWT1_N required for performing an N-th reset operation is, for example, 1.15 milliseconds; a first set time tWT0_1 required for performing a first set operation is, for example, 0.7 milliseconds; a second set time tWT0_N required for performing an N-th set operation is, for example, 1.1 milliseconds. Accordingly, it can calculated from the above that the reset time variation rate=(tWT1_N−tWT1_1)/tWT1_1=0.15, and the set time variation rate=(tWT0_N−tWT0_1)/tWT0_1=0.57. Therefore, a difference of the set time variation rate to the reset time variation rate=0.42. Similarly, under the premise that the set time variation rate is greater than the reset time variation rate, by determining whether the difference of the set time variation rate to the reset time variation rate is greater than the reference value Y preset, steps S272 or S273 of FIG. 2 may be performed to adjust the voltage value of the set voltage and increase the energy of the set operation.

In FIG. 4A, a first reset time tWT1_1 required for performing a first reset operation is, for example, 1.0 milliseconds; a second reset time tWT1_N required for performing an N-th reset operation is, for example, 1.5 milliseconds; a first set time tWT0_1 required for performing a first set operation is, for example, 0.8 milliseconds; a second set time tWT0_N required for performing an N-th set operation is, for example, 0.92 milliseconds. Accordingly, it can calculated from the above that the reset time variation rate=(tWT1_N−tWT1_1)/tWT1_1=0.50, and the set time variation rate=(tWT0_N−tWT0_1)/tWT0_1=0.15. Therefore, a difference of the reset time variation rate and the set time variation rate=0.35.

Based on the reset time variation rate greater than the set time variation rate, by determining whether the difference of the reset time variation rate to the set time variation rate is greater than the reference value Y preset, steps S282 or S283 of FIG. 2 may be performed to adjust the voltage value of the reset voltage and increase the energy of the reset operation.

In FIG. 4B, a first reset time tWT1_1 required for performing a first reset operation is, for example, 0.7 milliseconds; a second reset time tWT1_N required for performing an N-th reset operation is, for example, 1.05 milliseconds; a first set time tWT0_1 required for performing a first set operation is, for example, 1.0 milliseconds; a second set time tWT0_N required for performing an N-th set operation is, for example, 1.15 milliseconds. Accordingly, it can calculated from the above that the reset time variation rate=(tWT1_N−tWT1_1)/tWT1_1=0.50, and the set time variation rate=(tWT0_N−tWT0_1)/tWT0_1=0.15. Therefore, a difference of the reset time variation rate and the set time variation rate=0.35.

Similarly, based on the reset time variation rate greater than the set time variation rate, by determining whether the difference of the reset time variation rate to the set time variation rate is greater than the reference value Y preset, steps S282 or S283 of FIG. 2 may be performed to adjust the voltage value of the reset voltage and increase the energy of the reset operation.

Figure 5:
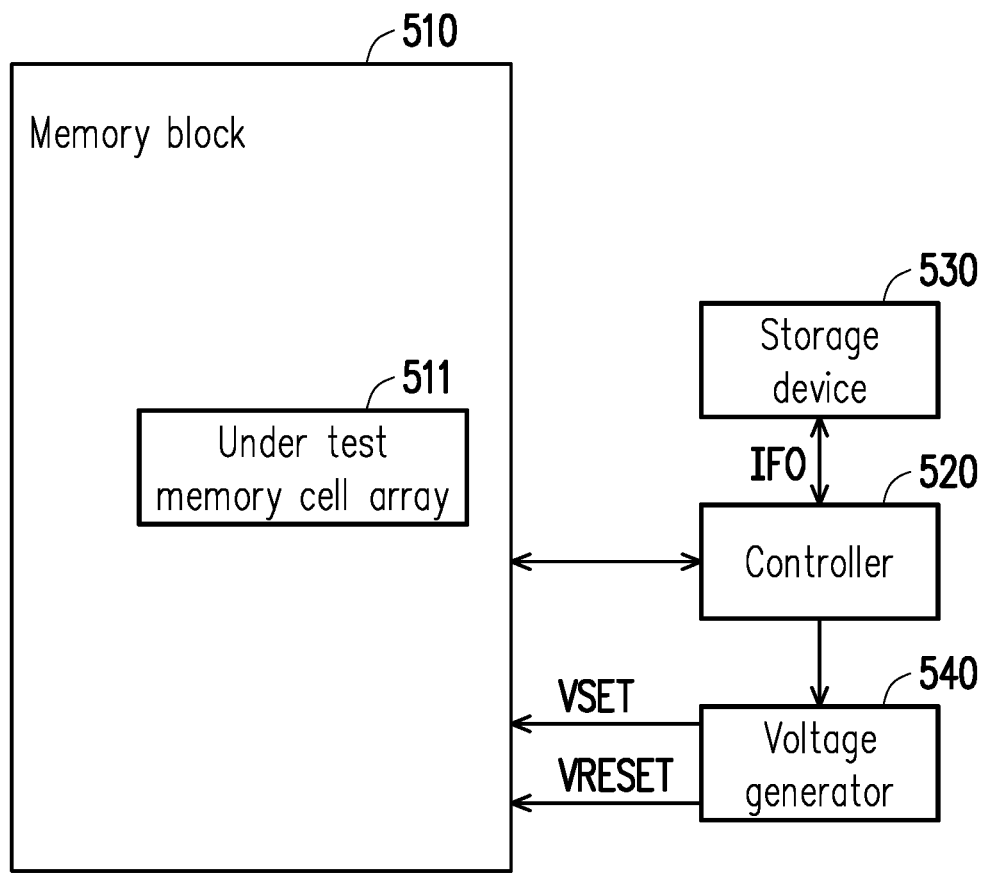
FIG. 5 illustrates a schematic diagram of a resistive memory apparatus according to an embodiment of the invention.

Referring to FIG. 5, FIG. 5 illustrates a schematic diagram of a resistive memory apparatus according to an embodiment of the invention. A resistive memory apparatus 500 includes a memory block 510, a controller 520, a storage device 530 and a voltage generator 540. During the adjustment operation of write-in voltage, the controller 520 may select an under test memory cell array 511 in the memory block 510, and perform the process of adjusting the write-in voltage illustrated in FIG. 1 on the under test memory cell array 511. The operations performed by the controller 520 have been described in detail in the foregoing embodiments and implementations, which are not repeated hereinafter.

The controller 520 may additionally write adjustment information IFO of the reset voltage VRESET and the set voltage VSET into the storage device 530. The storage device 530 may be any form of memory without particular limitation. The voltage generator 540 is configured to provide the reset voltage VRESET and the set voltage VSET to the memory block 510. Here, the controller 520 may control the voltage generator 540 to adjust the reset voltage VRESET and the set voltage VSET according to the adjustment information IFO of the reset voltage VRESET and the set voltage VSET recorded by the storage device 530.

In terms of hardware architecture, the controller 520 may be a processor with computing capability. Alternatively, the controller 520 may be a hardware circuit designed through Hardware Description Language (HDL) or any other well-known design methods for digital circuit and may be implemented in from of Field Programmable Gate Array (FPGA), Complex Programmable Logic Device (CPLD) or Application-specific Integrated Circuit (ASIC).

In summary, according to the invention, the reset operations and the set operations are performed on the under test memory cell array being a part of the resistive memory. By recording the reset time variation rate of the reset operations and the set time variation rate of the set operations, whether the setting energy of the set operations or the resetting energy of the reset operations are insufficient may be determined, and the voltage value of the set voltage and the reset voltage may be adjusted accordingly. In this way, the reset operations and the set operations of the resistive memory may be balanced to improve the use efficiency.

The invention claimed is:

1. An adjusting method for write-in voltage adapted to a resistive memory, comprising:
    selecting an under test memory cell array in the resistive memory;
    performing N reset operations on a plurality of memory cells of the under test memory cell array according to a reset voltage, and performing N set operations on the memory cells of the under test memory cell array according to a set voltage, wherein n is an integer greater than 1;

calculating a reset time variation rate of the reset operations and a set time variation rate of the set operations; and adjusting a voltage value of one of the set voltage and the reset voltage according to the reset time variation rate and the set time variation rate.

2. The adjusting method of claim 1, wherein the step of calculating the reset time variation rate of the reset operations comprises:

calculating a first reset time of a first reset operation and a second reset time of an N-th reset operation, and dividing a difference between the second reset time and the first reset time by the first reset time to generate the reset time variation rate.

3. The adjusting method of claim 1, wherein the step of calculating the set time variation rate of the set operations comprises:

calculating a first set time of a first set operation and a second set time of an N-th set operation, and dividing a difference between the second set time and the first set time by the first set time to generate the set time variation rate.

4. The adjusting method of claim 1, wherein the step of adjusting the voltage value of one of the set voltage and the reset voltage according to the reset time variation rate and the set time variation rate comprises:

comparing the reset time variation rate and the set time variation rate to determine whether to adjust the voltage value of the reset voltage or the voltage value of the set voltage.

5. The adjusting method of claim 4, wherein the voltage value of the reset voltage is selected and adjusted when the reset time variation rate is greater than the set time variation rate; the voltage value of the set voltage is selected and adjusted when the set time variation rate is greater than the reset time variation rate.

6. The adjusting method of claim 5, wherein when the reset time variation rate is greater than the set time variation rate, the adjusting method further comprises:

calculating a variation rate difference of the reset time variation rate to the set time variation rate;

increasing the reset voltage by a first voltage when the variation rate difference is greater than a reference value preset; and increasing the reset voltage by a second voltage when the variation rate difference is not greater than the reference value;

wherein the first voltage is greater than the second voltage.

7. The adjusting method of claim 5, wherein when the set time variation rate is greater than the reset time variation rate, the adjusting method further comprises:

calculating a variation rate difference of the set time variation rate to the reset time variation rate;

increasing the set voltage by a first voltage when the variation rate difference is greater than a reference value preset; and increasing the set voltage by a second voltage when the variation rate difference is not greater than the reference value;

wherein the first voltage is greater than the second voltage.

8. The adjusting method of claim 1, further comprising: recording adjustment information of the reset voltage and the set voltage in a storage device.

9. A resistive memory apparatus, comprising:
an under test memory cell array; and a controller, coupled to the under test memory cell array, and configured to:

perform N reset operations on a plurality of memory cells of the under test memory cell array according to a reset voltage, and perform N set operations on the memory cells of the under test memory cell array according to a set voltage, wherein n is an integer greater than 1;

calculate a reset time variation rate of the reset operations and a set time variation rate of the set operations; and adjust a voltage value of one of the set voltage and the reset voltage according to the reset time variation rate and the set time variation rate.

10. The resistive memory apparatus of claim 9, wherein the controller calculates a first reset time of a first reset operation and a second reset time of an N-th reset operation, and divides a difference between the second reset time and the first reset time by the first reset time to generate the reset time variation rate.

11. The resistive memory apparatus of claim 9, wherein the controller calculates a first set time of a first set operation and a second set time of an N-th set operation, and divides a difference between the second set time and the first set time by the first set time to generate the set time variation rate.

12. The resistive memory apparatus of claim 9, wherein the controller compares the reset time variation rate and the set time variation rate to determine whether to adjust the voltage value of the reset voltage or the voltage value of the set voltage.

13. The resistive memory apparatus of claim 12, wherein the controller selects and adjusts the voltage value of the reset voltage when the reset time variation rate is greater than the set time variation rate; the controller selects and adjusts the voltage value of the set voltage when the set time variation rate is greater than the reset time variation rate.

14. The resistive memory apparatus of claim 13, wherein when the reset time variation rate is greater than the set time variation rate, the controller is configured to:

calculate a variation rate difference of the reset time variation rate to the set time variation rate;

increase the reset voltage by a first voltage when the variation rate difference is greater than a reference value preset; and increase the reset voltage by a second voltage when the variation rate difference is not greater than the reference value;

wherein the first voltage is greater than the second voltage.

15. The resistive memory apparatus of claim 13, wherein when the set time variation rate is greater than the reset time variation rate, the controller is configured to:

calculate a variation rate difference of the set time variation rate to the reset time variation rate;

increase the set voltage by a first voltage when the variation rate difference is greater than a reference value preset; and increase the set voltage by a second voltage when the variation rate difference is not greater than the reference value;

wherein the first voltage is greater than the second voltage.

16. The resistive memory apparatus of claim 9, further comprising:

a storage device, coupled to the controller, and configured to record adjustment information of the reset voltage and the set voltage.

17. The resistive memory apparatus of claim 9, further comprising:
   a write-in voltage generator, coupled to the controller and the under test memory cell array, and configured to generate the set voltage and the reset voltage.

* * * * *